(12) United States Patent
Watanabe

(10) Patent No.: US 10,125,282 B2
(45) Date of Patent: Nov. 13, 2018

(54) INK COMPOSITION

(71) Applicant: SEIKO EPSON CORPORATION, Tokyo (JP)

(72) Inventor: Shotaro Watanabe, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/348,427

(22) Filed: Nov. 10, 2016

(65) Prior Publication Data
US 2017/0137651 A1 May 18, 2017

(30) Foreign Application Priority Data

Nov. 13, 2015 (JP) ................. 2015-222779

(51) Int. Cl.
| C09D 11/033 | (2014.01) |
| C09D 11/36 | (2014.01) |
| C09D 11/02 | (2014.01) |
| H01L 51/00 | (2006.01) |
| H01L 51/50 | (2006.01) |

(52) U.S. Cl.
CPC .............. *C09D 11/36* (2013.01); *C09D 11/02* (2013.01); *C09D 11/033* (2013.01); *H01L 51/005* (2013.01); *H01L 51/0034* (2013.01); *H01L 51/0003* (2013.01); *H01L 51/5012* (2013.01)

(58) Field of Classification Search
None
See application file for complete search history.

(56) References Cited

U.S. PATENT DOCUMENTS

| 3,450,663 | A | * | 6/1969 | Cockerham | C08J 3/091 106/311 |
| 2002/0189495 | A1 | | 12/2002 | Hayashi et al. | |
| 2004/0225056 | A1 | * | 11/2004 | Spreitzer | C09K 11/06 524/570 |
| 2007/0173578 | A1 | * | 7/2007 | Spreitzer | C09K 11/025 524/356 |
| 2007/0228356 | A1 | | 10/2007 | Makiura et al. | |
| 2008/0265214 | A1 | * | 10/2008 | Steiger | C09K 11/025 252/500 |
| 2009/0103284 | A1 | | 4/2009 | Suzuki et al. | |
| 2014/0024841 | A1 | | 1/2014 | Sagisaka et al. | |
| 2015/0064828 | A1 | * | 3/2015 | Watanabe | C09K 11/06 438/46 |

(Continued)

FOREIGN PATENT DOCUMENTS

| JP | 2002-285086 A | 10/2002 |
| JP | 2007-281039 A | 10/2007 |
| JP | 2008-503870 A | 2/2008 |

(Continued)

OTHER PUBLICATIONS

Fisher Scientific, product webpage for Phenethyl alcohol, 99%, ACROS Organics. Retrieved from www.fishersci.com on Mar. 19, 2018. (Year: 2018).*

(Continued)

*Primary Examiner* — Richard A Huhn
(74) *Attorney, Agent, or Firm* — Oliff PLC

(57) ABSTRACT

An ink composition contains a solid component, a hydrophobic solvent A, a hydrophilic solvent B, and an amphiphilic solvent C, wherein the solvent C is an alcohol having 8 or more carbon atoms.

14 Claims, 13 Drawing Sheets

| TYPE OF SOLVENT | NAME OF COMPOUND | PHYSICAL PROPERTIES | |
|---|---|---|---|
| | | VISCOSITY / 23°C (mPa·s) | STANDARD BOILING POINT (°C) |
| A1 AROMATIC COMPOUND | DIPB | 2.0 | 210 |
| | CHB | 2.4 | 236 |
| | DPE | 6.0 | 262 |
| | 3PT | 5.8 | 272 |
| | BDMPE | 33.0 | 333 |
| A2 HYDROCARBON-BASED COMPOUND | DECANE | 0.8 | 174 |
| | UNDECANE | 1.1 | 196 |
| | DODECANE | 1.4 | 216 |
| | TETRADECANE | 2.5 | 251 |
| | HEXADECANE | 3.3 | 280 |
| | NAPHTESOL 160 | 0.7 / 40°C | 157 - 179 |
| | NAPHTESOL 200 | 1.3 / 40°C | 201 - 217 |
| | NAPHTESOL 220 | 1.6 / 40°C | 221 - 240 |
| A2 OTHERS | 7E2M4U | 36.4 | 264 |
| B1 GLYCOL ETHER-BASED COMPOUND | DEG | 38.0 | 245 |
| | DPG | 107.0 | 231 |
| | TEG | 48.0 | 287 |
| | TetraEG | 55.0 | 328 |
| B2 ALKANE DIOL-BASED COMPOUND | 23BD | 83.2 | 182 |
| | 12PD | 43.2 | 188 |
| | 12ED | 21.0 | 197 |
| | 2M24PD | 34.4 | 198 |
| | 13BD | 92.1 | 207 |
| | 14BD | 65.0 | 228 |
| | 2E13HD | 212.0 | 244 |
| C ALCOHOL | 1 - OCTANOL | 7.3 | 195 |
| | 1 - NONANOL | 8.6 | 215 |
| | 1 - DECANOL | 14.3 | 233 |
| | 1 - UNDECANOL | 17.2 | 243 |
| | 1 - DODECANOL | 16.1 | 262 |
| | 2 - NONANOL | 8.0 | 198 |
| | 2 - UNDECANOL | 15.6 | 228 |

(56) References Cited

U.S. PATENT DOCUMENTS

| | | |
|---|---|---|
| 2015/0097173 A1 | 4/2015 | Watanabe et al. |
| 2018/0030296 A1* | 2/2018 | Fujii .................. C09D 11/36 |

FOREIGN PATENT DOCUMENTS

| | | |
|---|---|---|
| JP | 2010-034316 A | 2/2010 |
| JP | 2012-023334 A | 2/2012 |
| JP | 2012-062460 A | 3/2012 |
| JP | 2012-230904 A | 11/2012 |
| WO | 2015/075929 A1 | 5/2015 |

OTHER PUBLICATIONS

Viswanath, D. S. et al., Viscosity of Liquids, Springer 2007, p. 296. (Year: 2007).*

Mar. 31, 2017 Extended Search Report issued in European Patent Application No. 16197811.9.

* cited by examiner

| TYPE OF SOLVENT | NAME OF COMPOUND | PHYSICAL PROPERTIES | |
| --- | --- | --- | --- |
| | | VISCOSITY / 23°C (mPa·s) | STANDARD BOILING POINT (°C) |
| A1 AROMATIC COMPOUND | DIPB | 2.0 | 210 |
| | CHB | 2.4 | 236 |
| | DPE | 6.0 | 262 |
| | 3PT | 5.8 | 272 |
| | BDMPE | 33.0 | 333 |
| A2 HYDROCARBON-BASED COMPOUND | DECANE | 0.8 | 174 |
| | UNDECANE | 1.1 | 196 |
| | DODECANE | 1.4 | 216 |
| | TETRADECANE | 2.5 | 251 |
| | HEXADECANE | 3.3 | 280 |
| | NAPHTESOL 160 | 0.7 / 40°C | 157 - 179 |
| | NAPHTESOL 200 | 1.3 / 40°C | 201 - 217 |
| | NAPHTESOL 220 | 1.6 / 40°C | 221 - 240 |
| A2 OTHERS | 7E2M4U | 36.4 | 264 |
| B1 GLYCOL ETHER-BASED COMPOUND | DEG | 38.0 | 245 |
| | DPG | 107.0 | 231 |
| | TEG | 48.0 | 287 |
| | TetraEG | 55.0 | 328 |
| B2 ALKANE DIOL-BASED COMPOUND | 23BD | 83.2 | 182 |
| | 12PD | 43.2 | 188 |
| | 12ED | 21.0 | 197 |
| | 2M24PD | 34.4 | 198 |
| | 13BD | 92.1 | 207 |
| | 14BD | 65.0 | 228 |
| | 2E13HD | 212.0 | 244 |
| C ALCOHOL | 1 - OCTANOL | 7.3 | 195 |
| | 1 - NONANOL | 8.6 | 215 |
| | 1 - DECANOL | 14.3 | 233 |
| | 1 - UNDECANOL | 17.2 | 243 |
| | 1 - DODECANOL | 18.1 | 262 |
| | 2 - NONANOL | 8.0 | 198 |
| | 2 - UNDECANOL | 15.6 | 228 |

FIG. 8

|  | SOLVENT A (A1 : A2 = 1 : 1 MIXING) | | SOLVENT B (B1 : B2 = 1 : 1 MIXING) | |
|---|---|---|---|---|
| No. | AROMATIC COMPOUND | HYDROCARBON-BASED COMPOUND | ALKANE DIOL-BASED COMPOUND | GLYCOL ETHER-BASED COMPOUND |
|  | A1 | A2 | B1 | B2 |
| 1 | DIPB | DECANE | 23BD | DPG |
| 2 | DIPB | UNDECANE | 2M24PD | TEG |
| 3 | DIPB | DODECANE | 14BD | TetraEG |
| 4 | DIPB | HEXADECANE | 23BD | DPG |
| 5 | DIPB | NAPHTESOL 160 | 2M24PD | TEG |
| 6 | DIPB | NAPHTESOL 220 | 14BD | TetraEG |
| 7 | DIPB | 7E2M4U | 23BD | DPG |
| 8 | CHB | DECANE | 23BD | DPG |
| 9 | CHB | UNDECANE | 2M24PD | TEG |
| 10 | CHB | DODECANE | 14BD | TetraEG |
| 11 | CHB | HEXADECANE | 23BD | DPG |
| 12 | CHB | NAPHTESOL 160 | 2M24PD | TEG |
| 13 | CHB | NAPHTESOL 220 | 14BD | TetraEG |
| 14 | CHB | 7E2M4U | 23BD | DPG |
| 15 | DPE | DECANE | 23BD | DPG |
| 16 | DPE | UNDECANE | 2M24PD | TEG |
| 17 | DPE | DODECANE | 14BD | TetraEG |
| 18 | DPE | HEXADECANE | 23BD | DPG |
| 19 | DPE | NAPHTESOL 160 | 2M24PD | TEG |
| 20 | DPE | NAPHTESOL 220 | 14BD | TetraEG |
| 21 | DPE | 7E2M4U | 23BD | DPG |
| 22 | 3PT | DECANE | 23BD | DPG |
| 23 | 3PT | UNDECANE | 2M24PD | TEG |
| 24 | 3PT | DODECANE | 14BD | TetraEG |
| 25 | 3PT | HEXADECANE | 23BD | DPG |
| 26 | 3PT | NAPHTESOL 160 | 2M24PD | TEG |
| 27 | 3PT | NAPHTESOL 220 | 14BD | TetraEG |
| 28 | 3PT | 7E2M4U | 23BD | DPG |
| 29 | BDMPE | DECANE | 23BD | DPG |
| 30 | BDMPE | UNDECANE | 2M24PD | TEG |
| 31 | BDMPE | DODECANE | 14BD | TetraEG |
| 32 | BDMPE | HEXADECANE | 23BD | DPG |
| 33 | BDMPE | NAPHTESOL 160 | 2M24PD | TEG |
| 34 | BDMPE | NAPHTESOL 220 | 14BD | TetraEG |
| 35 | BDMPE | 7E2M4U | 23BD | DPG |

FIG. 9

| No. | SOLVENT A (A1 : A2 = 1 : 1 MIXING) | | SOLVENT B (B1 : B2 = 1 : 1 MIXING) | |
|---|---|---|---|---|
| | AROMATIC COMPOUND | HYDROCARBON-BASED COMPOUND | ALKANE DIOL-BASED COMPOUND | GLYCOL ETHER-BASED COMPOUND |
| | A1 | A2 | B1 | B2 |
| 36 | DIPB | DECANE | 23BD | DPG |
| 37 | DIPB | UNDECANE | 2M24PD | TEG |
| 38 | DIPB | DODECANE | 14BD | TetraEG |
| 39 | DIPB | HEXADECANE | 23BD | DPG |
| 40 | DIPB | NAPHTESOL 160 | 2M24PD | TEG |
| 41 | DIPB | NAPHTESOL 220 | 14BD | TetraEG |
| 42 | DIPB | 7E2M4U | 23BD | DPG |
| 43 | CHB | DECANE | 23BD | DPG |
| 44 | CHB | UNDECANE | 2M24PD | TEG |
| 45 | CHB | DODECANE | 14BD | TetraEG |
| 46 | CHB | HEXADECANE | 23BD | DPG |
| 47 | CHB | NAPHTESOL 160 | 2M24PD | TEG |
| 48 | CHB | NAPHTESOL 220 | 14BD | TetraEG |
| 49 | CHB | 7E2M4U | 23BD | DPG |
| 50 | DPE | DECANE | 23BD | DPG |
| 51 | DPE | UNDECANE | 2M24PD | TEG |
| 52 | DPE | DODECANE | 14BD | TetraEG |
| 53 | DPE | HEXADECANE | 23BD | DPG |
| 54 | DPE | NAPHTESOL 160 | 2M24PD | TEG |
| 55 | DPE | NAPHTESOL 220 | 14BD | TetraEG |
| 56 | DPE | 7E2M4U | 23BD | DPG |
| 57 | 3PT | DECANE | 23BD | DPG |
| 58 | 3PT | UNDECANE | 2M24PD | TEG |
| 59 | 3PT | DODECANE | 14BD | TetraEG |
| 60 | 3PT | HEXADECANE | 23BD | DPG |
| 61 | 3PT | NAPHTESOL 160 | 2M24PD | TEG |
| 62 | 3PT | NAPHTESOL 220 | 14BD | TetraEG |
| 63 | 3PT | 7E2M4U | 23BD | DPG |
| 64 | BDMPE | DECANE | 23BD | DPG |
| 65 | BDMPE | UNDECANE | 2M24PD | TEG |
| 66 | BDMPE | DODECANE | 14BD | TetraEG |
| 67 | BDMPE | HEXADECANE | 23BD | DPG |
| 68 | BDMPE | NAPHTESOL 160 | 2M24PD | TEG |
| 69 | BDMPE | NAPHTESOL 220 | 14BD | TetraEG |
| 70 | BDMPE | 7E2M4U | 23BD | DPG |

FIG.10

| No. | SOLVENT A (A1 : A2 = 1 : 1 MIXING) | | SOLVENT B (B1 : B2 = 1 : 1 MIXING) | |
|---|---|---|---|---|
| | AROMATIC COMPOUND | HYDROCARBON-BASED COMPOUND | ALKANE DIOL-BASED COMPOUND | GLYCOL ETHER-BASED COMPOUND |
| | A1 | A2 | B1 | B2 |
| 71 | DIPB | DECANE | 23BD | DPG |
| 72 | DIPB | UNDECANE | 2M24PD | TEG |
| 73 | DIPB | DODECANE | 14BD | TetraEG |
| 74 | DIPB | HEXADECANE | 23BD | DPG |
| 75 | DIPB | NAPHTESOL 160 | 2M24PD | TEG |
| 76 | DIPB | NAPHTESOL 220 | 14BD | TetraEG |
| 77 | DIPB | 7E2M4U | 23BD | DPG |
| 78 | CHB | DECANE | 23BD | DPG |
| 79 | CHB | UNDECANE | 2M24PD | TEG |
| 80 | CHB | DODECANE | 14BD | TetraEG |
| 81 | CHB | HEXADECANE | 23BD | DPG |
| 82 | CHB | NAPHTESOL 160 | 2M24PD | TEG |
| 83 | CHB | NAPHTESOL 220 | 14BD | TetraEG |
| 84 | CHB | 7E2M4U | 23BD | DPG |
| 85 | DPE | DECANE | 23BD | DPG |
| 86 | DPE | UNDECANE | 2M24PD | TEG |
| 87 | DPE | DODECANE | 14BD | TetraEG |
| 88 | DPE | HEXADECANE | 23BD | DPG |
| 89 | DPE | NAPHTESOL 160 | 2M24PD | TEG |
| 90 | DPE | NAPHTESOL 220 | 14BD | TetraEG |
| 91 | DPE | 7E2M4U | 23BD | DPG |
| 92 | 3PT | DECANE | 23BD | DPG |
| 93 | 3PT | UNDECANE | 2M24PD | TEG |
| 94 | 3PT | DODECANE | 14BD | TetraEG |
| 95 | 3PT | HEXADECANE | 23BD | DPG |
| 96 | 3PT | NAPHTESOL 160 | 2M24PD | TEG |
| 97 | 3PT | NAPHTESOL 220 | 14BD | TetraEG |
| 98 | 3PT | 7E2M4U | 23BD | DPG |
| 99 | BDMPE | DECANE | 23BD | DPG |
| 100 | BDMPE | UNDECANE | 2M24PD | TEG |
| 101 | BDMPE | DODECANE | 14BD | TetraEG |
| 102 | BDMPE | HEXADECANE | 23BD | DPG |
| 103 | BDMPE | NAPHTESOL 160 | 2M24PD | TEG |
| 104 | BDMPE | NAPHTESOL 220 | 14BD | TetraEG |
| 105 | BDMPE | 7E2M4U | 23BD | DPG |

FIG.11

| No. | SOLVENT A (EQUAL MIXING RATIO OF A1 : A2 OR SINGLE BLENDING) | | SOLVENT B (SINGLE BLENDING OF B1 OR B2) | |
|---|---|---|---|---|
| | AROMATIC COMPOUND | HYDROCARBON-BASED COMPOUND | ALKANE DIOL-BASED COMPOUND | GLYCOL ETHER-BASED COMPOUND |
| | A1 | A2 | B1 | B2 |
| 106 | 3PT | DODECANE | (NOT BLENDED) | DEG |
| 107 | CHB | (NOT BLENDED) | (NOT BLENDED) | DEG |
| 108 | (NOT BLENDED) | DODECANE | (NOT BLENDED) | DEG |
| 109 | (NOT BLENDED) | DODECANE | (NOT BLENDED) | DEG |
| 110 | (NOT BLENDED) | DODECANE | 2E13HD | (NOT BLENDED) |

FIG.12

| No. | MISCIBILITY OF SOLVENTS / MIXING RATIO OF SOLVENTS (A:B:C (MASS %)) | | | | | | |
|---|---|---|---|---|---|---|---|
| | 50:49:1 SOLVENT C 1% EXAMPLE | 50:45:5 SOLVENT C 5% EXAMPLE | 50:40:10 SOLVENT C 10% EXAMPLE | 55:35:10 SOLVENT C 10% EXAMPLE | 40:50:10 SOLVENT C 10% EXAMPLE | 50:50:0 FREE OF SOLVENT C COMPARATIVE EXAMPLE | 50:49.5:0.5 SOLVENT C 0.5% COMPARATIVE EXAMPLE |
| 1 | A | A | A | A | A | B | B |
| 2 | A | A | A | A | A | B | B |
| 3 | A | A | A | A | A | B | B |
| 4 | A | A | A | A | A | B | B |
| 5 | A | A | A | A | A | B | B |
| 6 | A | A | A | A | A | B | B |
| 7 | A | A | A | A | A | B | B |
| 8 | A | A | A | A | A | B | B |
| 9 | A | A | A | A | A | B | B |
| 10 | A | A | A | A | A | B | B |
| 11 | A | A | A | A | A | B | B |
| 12 | A | A | A | A | A | B | B |
| 13 | A | A | A | A | A | B | B |
| 14 | A | A | A | A | A | B | B |
| 15 | A | A | A | A | A | B | B |
| 16 | A | A | A | A | A | B | B |
| 17 | A | A | A | A | A | B | B |
| 18 | A | A | A | A | A | B | B |
| 19 | A | A | A | A | A | B | B |
| 20 | A | A | A | A | A | B | B |
| 21 | A | A | A | A | A | B | B |
| 22 | A | A | A | A | A | B | B |
| 23 | A | A | A | A | A | B | B |
| 24 | A | A | A | A | A | B | B |
| 25 | A | A | A | A | A | B | B |
| 26 | A | A | A | A | A | B | B |
| 27 | A | A | A | A | A | B | B |
| 28 | A | A | A | A | A | B | B |
| 29 | A | A | A | A | A | B | B |
| 30 | A | A | A | A | A | B | B |
| 31 | A | A | A | A | A | B | B |
| 32 | A | A | A | A | A | B | B |
| 33 | A | A | A | A | A | B | B |
| 34 | A | A | A | A | A | B | B |
| 35 | A | A | A | A | A | B | B |

A: (FAVORABLE): MISCIBLE, B (NOT FAVORABLE): NOT MISCIBLE

FIG.13

| No. | MISCIBILITY OF SOLVENTS / MIXING RATIO OF SOLVENTS (A : B : C (MASS %)) | | | | | |
|---|---|---|---|---|---|---|
| | 50:49:1 SOLVENT C 1% EXAMPLE | 50:45:5 SOLVENT C 5% EXAMPLE | 50:40:10 SOLVENT C 10% EXAMPLE | 55:35:10 SOLVENT C 10% EXAMPLE | 40:50:10 SOLVENT C 10% EXAMPLE | 50:49.5:0.5 SOLVENT C 0.5% COMPARATIVE EXAMPLE |
| 36 | A | A | A | A | A | B |
| 37 | A | A | A | A | A | B |
| 38 | A | A | A | A | A | B |
| 39 | A | A | A | A | A | B |
| 40 | A | A | A | A | A | B |
| 41 | A | A | A | A | A | B |
| 42 | A | A | A | A | A | B |
| 43 | A | A | A | A | A | B |
| 44 | A | A | A | A | A | B |
| 45 | A | A | A | A | A | B |
| 46 | A | A | A | A | A | B |
| 47 | A | A | A | A | A | B |
| 48 | A | A | A | A | A | B |
| 49 | A | A | A | A | A | B |
| 50 | A | A | A | A | A | B |
| 51 | A | A | A | A | A | B |
| 52 | A | A | A | A | A | B |
| 53 | A | A | A | A | A | B |
| 54 | A | A | A | A | A | B |
| 55 | A | A | A | A | A | B |
| 56 | A | A | A | A | A | B |
| 57 | A | A | A | A | A | B |
| 58 | A | A | A | A | A | B |
| 59 | A | A | A | A | A | B |
| 60 | A | A | A | A | A | B |
| 61 | A | A | A | A | A | B |
| 62 | A | A | A | A | A | B |
| 63 | A | A | A | A | A | B |
| 64 | A | A | A | A | A | B |
| 65 | A | A | A | A | A | B |
| 66 | A | A | A | A | A | B |
| 67 | A | A | A | A | A | B |
| 68 | A | A | A | A | A | B |
| 69 | A | A | A | A | A | B |
| 70 | A | A | A | A | A | B |

A : (FAVORABLE) : MISCIBLE, B (NOT FAVORABLE) : NOT MISCIBLE

FIG.14

| No. | MISCIBILITY OF SOLVENTS / MIXING RATIO OF SOLVENTS (A:B:C (MASS %)) | | | | | |
|---|---|---|---|---|---|---|
| | 50:49:1 SOLVENT C 1% EXAMPLE | 50:45:5 SOLVENT C 5% EXAMPLE | 50:40:10 SOLVENT C 10% EXAMPLE | 55:35:10 SOLVENT C 10% EXAMPLE | 40:50:10 SOLVENT C 10% EXAMPLE | 50:49.5:0.5 SOLVENT C 0.5% COMPARATIVE EXAMPLE |
| 71 | A | A | A | A | A | B |
| 72 | A | A | A | A | A | B |
| 73 | A | A | A | A | A | B |
| 74 | A | A | A | A | A | B |
| 75 | A | A | A | A | A | B |
| 76 | A | A | A | A | A | B |
| 77 | A | A | A | A | A | B |
| 78 | A | A | A | A | A | B |
| 79 | A | A | A | A | A | B |
| 80 | A | A | A | A | A | B |
| 81 | A | A | A | A | A | B |
| 82 | A | A | A | A | A | B |
| 83 | A | A | A | A | A | B |
| 84 | A | A | A | A | A | B |
| 85 | A | A | A | A | A | B |
| 86 | A | A | A | A | A | B |
| 87 | A | A | A | A | A | B |
| 88 | A | A | A | A | A | B |
| 89 | A | A | A | A | A | B |
| 90 | A | A | A | A | A | B |
| 91 | A | A | A | A | A | B |
| 92 | A | A | A | A | A | B |
| 93 | A | A | A | A | A | B |
| 94 | A | A | A | A | A | B |
| 95 | A | A | A | A | A | B |
| 96 | A | A | A | A | A | B |
| 97 | A | A | A | A | A | B |
| 98 | A | A | A | A | A | B |
| 99 | A | A | A | A | A | B |
| 100 | A | A | A | A | A | B |
| 101 | A | A | A | A | A | B |
| 102 | A | A | A | A | A | B |
| 103 | A | A | A | A | A | B |
| 104 | A | A | A | A | A | B |
| 105 | A | A | A | A | A | B |

A : (FAVORABLE) : MISCIBLE, B (NOT FAVORABLE) : NOT MISCIBLE

FIG.15

| No. | MISCIBILITY OF SOLVENTS / MIXING RATIO OF SOLVENTS (A : B : C (MASS %)) | | | | | |
| --- | --- | --- | --- | --- | --- | --- |
| | 50 : 49 : 1 | 50 : 45 : 5 | 45 : 50 : 5 | 50 : 40 : 10 | 55 : 35 : 10 | 50 : 49.5 : 0.5 |
| | SOLVENT C 1 % | SOLVENT C 5 % | SOLVENT C 5 % | SOLVENT C 10 % | SOLVENT C 10 % | SOLVENT C 0.5 % |
| | EXAMPLE | EXAMPLE | EXAMPLE | EXAMPLE | EXAMPLE | COMPAR-ATIVE EXAMPLE |
| 106 | A | A | A | A | A | B |
| 107 | A | A | A | A | A | B |
| 108 | A | A | A | A | A | B |
| 109 | A | A | A | A | A | B |
| 110 | A | A | A | A | A | B |

A : (FAVORABLE) : MISCIBLE, B (NOT FAVORABLE) : NOT MISCIBLE

FIG.16

INK COMPOSITION

BACKGROUND

1. Technical Field

The present invention relates to an ink composition.

2. Related Art

In the past, as an aqueous ink or a non-aqueous ink, in order to satisfy desired ink properties, there has been known an ink in which multiple types of solvents are blended in combination.

For example, in JP-A-2012-62460 (PTL 1), as an ink composition containing a color material (pigment) in a dispersed state and also containing multiple types of solvents, a non-aqueous inkjet ink composition, in which a pigment is dispersed in at least one solvent selected from the group consisting of hydrocarbon-based solvents, ester-based solvents, alcohol-based solvents, N-methylpyrrolidone, glycol ether-based solvents, and the like has been proposed.

Further, for example, in JP-A-2012-23334 (PTL 2), as an ink containing multiple types of solvents, an ink in which an organic semiconductor precursor is dissolved in at least one solvent selected from aromatic hydrocarbons, halogen compounds, ethers, and the like has been proposed.

However, when multiple types of solvents were used in combination as in the case of the inks (ink compositions) described in PTL 1 and PTL 2, there was a problem that the types of solvents which can be blended together are likely to be limited. Specifically, it was necessary to use a hydrophilic solvent or a hydrophobic solvent according to the solubility, dispersibility, or the like of a solid component contained in the ink. For example, a hydrophobic organic solvent and a hydrophilic organic solvent are less likely to be miscible with each other, and when these solvents were mixed, these were separated or caused cloudiness, and therefore, it was difficult to blend these organic solvents in combination in an ink.

On the other hand, in the case where an inkjet method in which an image or a film is formed by ejecting such an ink as a liquid droplet from an inkjet head, it is necessary to ensure ink physical properties such that the ink can be stably ejected as a liquid droplet, and also drying properties, leveling properties, and the like. In order for this, there was also a desire to blend multiple types of solvents having different viscosities or polarities in combination.

That is, there was a task to further increase the choice of solvents which can adjust the ink properties such as viscosity without being limited to the hydrophilicity, hydrophobicity, and the like of the solvents.

SUMMARY

An advantage of some aspects of the invention is to solve at least a part of the problems described above, and the invention can be implemented as the following modes or application examples.

Application Example

An ink composition according to this application example includes a solid component, a hydrophobic solvent A, a hydrophilic solvent B, and an amphiphilic solvent C, wherein the solvent C is an alcohol having 8 or more carbon atoms.

According to this application example, by blending an alcohol having 8 or more carbon atoms as the amphiphilic solvent C, the miscibility between the solvents having different polarities is improved, and therefore, it is possible to increase the combination of types of solvents which can be blended together. More specifically, the solvent C includes a hydrophobic group (an alkyl group having 8 or more carbon atoms) and a hydrophilic group (a hydroxy group), and therefore the hydrophobic group has affinity for the hydrophobic solvent A, and the hydrophilic group has affinity for the hydrophilic solvent B. Due to this, the miscibility between the solvent A and the solvent B is improved by interposing the solvent C therebetween, and therefore, even if these solvents are blended in combination, the occurrence of separation or cloudiness is suppressed.

In addition, because of this, the choice of solvents having different boiling points or the like can be increased. As a result, the adjustment of the ink physical properties such as viscosity is facilitated, and it becomes easy to ensure the drying properties and leveling properties of the ejected liquid droplet.

According to this, an ink composition which is adaptable to the solubility or dispersibility of the solid component to be added and has necessary properties for the ink can be provided.

In the ink composition according to the application example, it is preferred that the solvent A contains at least one compound selected from aromatic compounds and hydrocarbon-based compounds, the solvent B contains at least one compound selected from glycol ether-based compounds and alkane diol-based compounds, and the solvent C is a monohydric alcohol.

According to this configuration, by blending the solvent C which is a monohydric alcohol, it becomes possible to blend an aromatic compound or a hydrocarbon-based compound and a glycol ether-based compound or an alkane diol-based compound having different polarities in combination. As a result, an ink favorable for an inkjet method can be provided by adjusting the viscosity of the ink and the drying properties and leveling properties of the liquid droplet, and the like.

In the ink composition according to the application example, it is preferred that the solvent A contains at least one compound selected from aromatic compounds and at least one compound selected from hydrocarbon-based compounds, the solvent B contains at least one compound selected from glycol ether-based compounds and at least one compound selected from alkane diol-based compounds, and the solvent C is a monohydric alcohol.

According to this configuration, by blending the solvent C which is a monohydric alcohol, it becomes possible to blend an aromatic compound and a hydrocarbon-based compound, and a glycol ether-based compound and an alkane diol-based compound having different polarities in combination. As a result, an ink favorable for an inkjet method can be provided by adjusting the viscosity of the ink and the drying properties and leveling properties of the liquid droplet, and the like.

In the ink composition according to the application example, it is preferred that the aromatic compounds are diisopropylbenzene, cyclohexylbenzene, diphenyl ether, 3-phenoxytoluene, and bis(dimethylphenyl)ethane, and the hydrocarbon-based compounds are decane, undecane, dodecane, tridecane, tetradecane, pentadecane, and hexadecane.

According to this configuration, since a solvent having a relatively high boiling point and a relatively low viscosity is contained as the solvent A, it becomes possible to decrease the viscosity of the ink and to ensure the leveling properties of the liquid droplet. Further, the solubility and dispersibility are improved for the solid component having relatively low hydrophilicity.

In the ink composition according to the application example, it is preferred that the glycol ether-based compounds are diethylene glycol, triethylene glycol, dipropylene glycol, and tetraethylene glycol, and the alkane diol-based compounds are 1,2-ethanediol, 1,2-propanediol, 1,3-butanediol, 1,4-butanediol, 2,3-butanediol, 1,5-pentanediol, 2-methyl-2,4-pentanediol, 1,6-hexanediol, and 2-ethyl-1,3-hexanediol.

According to this configuration, since a solvent having a relatively high boiling point and a relatively high viscosity is blended as the solvent B, it becomes possible to adjust the viscosity of the ink and to ensure the leveling properties of the liquid droplet. Further, the solubility and dispersibility are improved for the solid component having relatively low hydrophilicity.

In the ink composition according to the application example, it is preferred that the solvent C is a monohydric alcohol having 8 to 13 carbon atoms, and contains at least one alcohol selected from 1-octanol, 1-nonanol, 1-decanol, 1-undecanol, 1-dodecanol, 1-tridecanol, 2-nonanol, and 2-undecanol.

According to this configuration, the miscibility of multiple types of solvents having different polarities can be further enhanced.

In the ink composition according to the application example, it is preferred that the content ratio of the solvent C is 1 mass % or more.

According to this configuration, the miscibility of multiple types of solvents having different polarities can be further enhanced. Therefore, in a process for forming an image or a film on an ejection target material with the ink as a liquid droplet, even if drying of the liquid droplet proceeds, the miscibility is maintained, and a uniform image or film can be formed.

From the viewpoint of ensuring further higher miscibility, the content ratio of the solvent C is preferably set to 5 mass % or more.

In the ink composition according to the application example, it is preferred that the viscosity of the solvent A at normal temperature is lower than that of the solvent B.

According to this configuration, in a process for forming an image or a film by drying the liquid droplet, the solvent A is volatilized before the solvent B and the solvent B is likely to remain, and therefore, the leveling properties are improved, and the flatness of an image or a film can be improved.

In the ink composition according to the application example, it is preferred that as the solvent A, a naphthene-based compound is contained.

According to this configuration, the viscosity of the ink composition is suppressed low, and thus, the leveling properties of the liquid droplet can be ensured.

In the ink composition according to the application example, it is preferred that as the solvent A, 7-ethyl-2-methyl-4-undecanol is contained.

According to this configuration, 7-ethyl-2-methyl-4-undecanol has a relatively high viscosity as the solvent A, and therefore, in the combination with the solvent B having a low viscosity, the adjustment of the viscosity of the ink composition is facilitated, and thus, the leveling properties of the liquid droplet can be improved.

In the ink composition according to the application example, it is preferred that as the solid component, a functional layer forming material is contained.

According to this configuration, in the case where a functional layer is formed using a liquid phase process, a homogeneous and flat functional layer can be obtained.

In the ink composition according to the application example, it is preferred that the functional layer forming material is a material for forming one layer selected from a functional layer composed of multiple layers including a light-emitting layer of an organic EL element.

According to this configuration, in the case where a functional layer of an organic EL element is formed using a liquid phase process, uneven application or uneven drying is reduced, and thus, a flat functional layer can be obtained.

In the ink composition according to the application example, it is preferred that as the solid component, a color material is contained.

According to this configuration, in the case where an image or the like is printed using an inkjet method, a printed material in which the color material is uniformly distributed and the surface is flat can be obtained.

In the ink composition according to the application example, it is preferred that as the solid component, a light transmissive resin which does not contain a color material is contained, and the content ratio of the resin is 0.1 mass or more and 10 mass % or less.

According to this configuration, by performing printing overlaying on a previously printed image or the like, a coating layer can be formed. As a result, the image is protected, and the abrasion resistance can be improved.

BRIEF DESCRIPTION OF THE DRAWINGS

The invention will be described with reference to the accompanying drawings, wherein like numbers reference like elements.

FIG. 8 is a chart showing the viscosities and standard boiling points of solvents.

FIG. 9 is a chart showing the compositions of solvents of inks for evaluating miscibility.

FIG. 10 is a chart showing the compositions of solvents of inks for evaluating miscibility.

FIG. 11 is a chart showing the compositions of solvents of inks for evaluating miscibility.

FIG. 12 is a chart showing the compositions of solvents of inks for evaluating miscibility.

FIG. 13 is a chart showing the results of evaluation of miscibility.

FIG. 14 is a chart showing the results of evaluation of miscibility.

FIG. 15 is a chart showing the results of evaluation of miscibility.

FIG. 16 is a chart showing the results of evaluation of miscibility.

DESCRIPTION OF EXEMPLARY EMBODIMENTS

Hereinafter, embodiments of the invention will be described with reference to the accompanying drawings.

Incidentally, in the following respective drawings, in order to make respective layers and respective members have a recognizable size, the dimensions of the respective layers and the respective members are made different from the actual ones.

Organic EL Device

Figure 1:
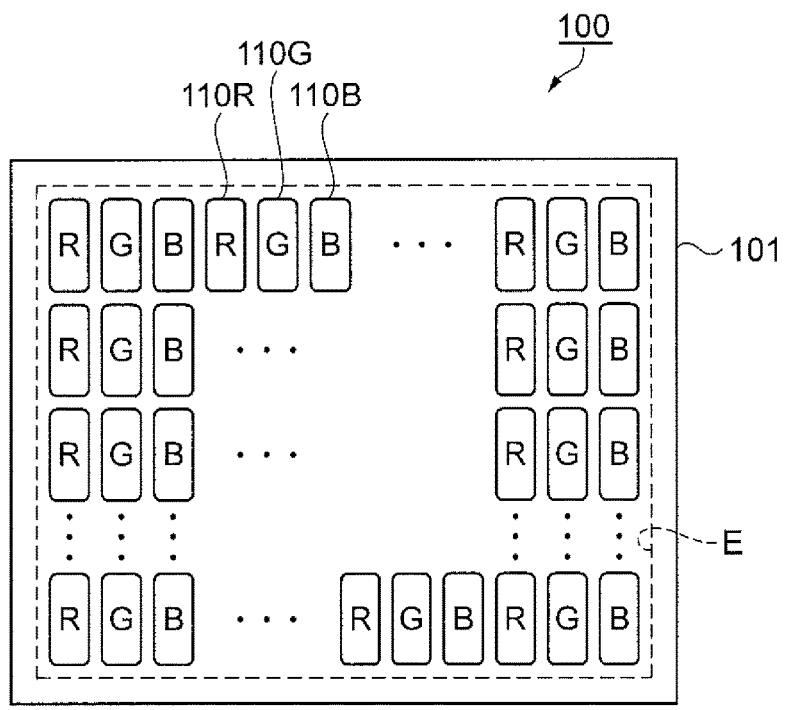
FIG. 1 is a schematic plan view showing a configuration of an organic EL device according to a first embodiment.

First, an organic EL device including an organic EL element according to an ink composition of this embodiment will be described with reference to FIG. 1. FIG. 1 is a schematic plan view showing a configuration of the organic EL device. In this embodiment, an organic EL device including an organic EL element is shown as an example, and an ink composition containing a functional layer forming material for forming an organic semiconductor layer (functional layer) of the organic EL element by an inkjet method will be described as an example.

An organic EL device 100 shown in FIG. 1 includes an element substrate 101 on which sub-pixels 110R, 110G, and 110B from which red (R), green (G), and blue (B) light emission (light emission color) is obtained are arranged. Each of the sub-pixels 110R, 110G, and 110B has a substantially rectangular shape, and is arranged in a matrix form in a display region E of the element substrate 101. Hereinafter, the sub-pixels 110R, 110G, and 110B of red (R), green (G), and blue (B) are also sometimes collectively referred to as "sub-pixel 110".

An organic EL element from which red (R) light emission is obtained is provided in the sub-pixel 110R. Similarly, an organic EL element from which green (G) light emission is obtained is provided in the sub-pixel 110G, and an organic EL element from which blue (B) light emission is obtained is provided in the sub-pixel 110B.

Figure 2:
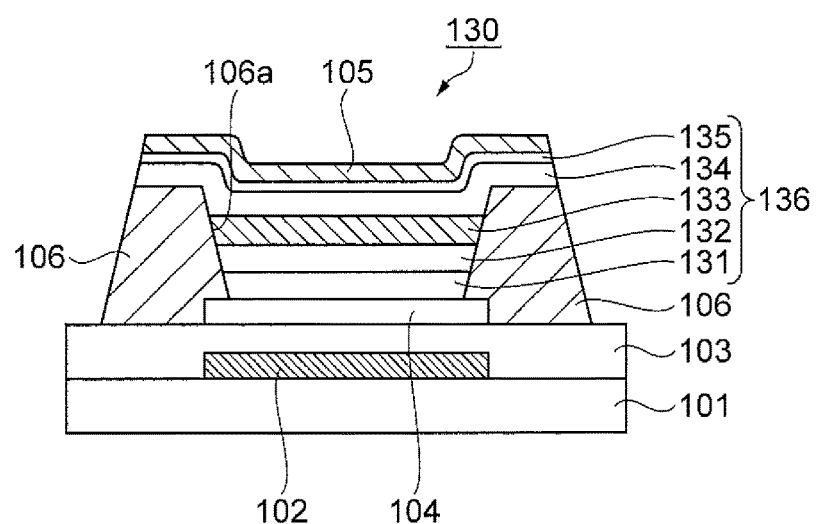
FIG. 2 is a schematic cross-sectional view showing a configuration of an organic EL element.

Next, the organic EL element according to this embodiment will be described with reference to FIG. 2. FIG. 2 is a schematic cross-sectional view showing a configuration of the organic EL element.

In each of the sub-pixels 110R, 110G, and 110E, an organic EL element 130 shown in FIG. 2 is provided. The organic EL element 130 includes a reflection layer 102 provided on the element substrate 101, an insulating film 103, a pixel electrode 104, a counter electrode 105, and a functional layer 136 which is provided between the pixel electrode 104 and the counter electrode 105 and includes a light-emitting layer 133.

The functional layer 136 includes a hole injection layer 131, a hole transport layer 132, a light-emitting layer 133, an electron transport layer 134, and an electron injection layer 135 stacked in this order from the pixel electrode 104 side. In particular, the constituent material of the light-emitting layer 133 is selected according to the light emission color. The configuration of the functional layer 136 is not limited thereto, and an intermediate layer or the like which controls the transfer of a carrier (a hole or an electron) may be provided in addition to these layers.

The organic EL element 130 adopts a configuration in which a light emission system is a top emission system as an example. Further, in FIG. 2, illustration of a pixel circuit is omitted.

The organic EL element 130 includes a partition wall 106 constituting an opening portion 106a on the pixel electrode 104. This partition wall 106 overlaps with the outer edge of the pixel electrode 104. In the functional layer 136 of the organic EL element 130, at least one layer of the hole injection layer 131, the hole transport layer 132, and the light-emitting layer 133 constituting the functional layer 136 is formed by a liquid phase process. The liquid phase process is a method for forming a layer by applying an ink composition containing a component constituting the layer and a solvent to the opening portion 106a serving as a film forming region surrounded by the partition wall 106 and drying. In order to form a layer with a desired film thickness, it is necessary to accurately apply a predetermined amount of the ink composition to the opening portion 106a, and, in this embodiment, an inkjet method (liquid droplet ejection method) is adopted as the liquid phase process. Hereinafter, the ink composition is sometimes referred to as simply "ink".

Method for Producing Organic EL Element

Figure 3:
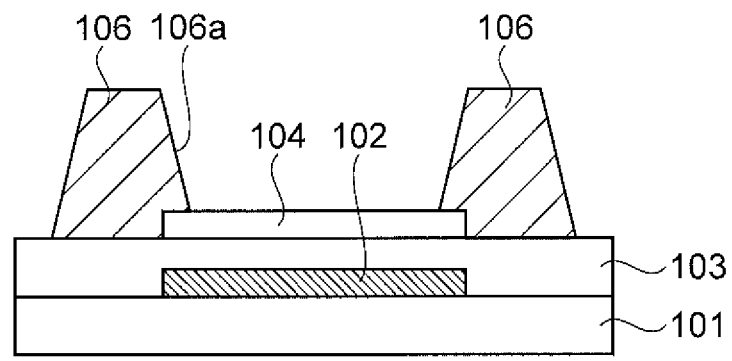
FIG. 3 is a schematic cross-sectional view showing a method for producing an organic EL element.
Figure 4:
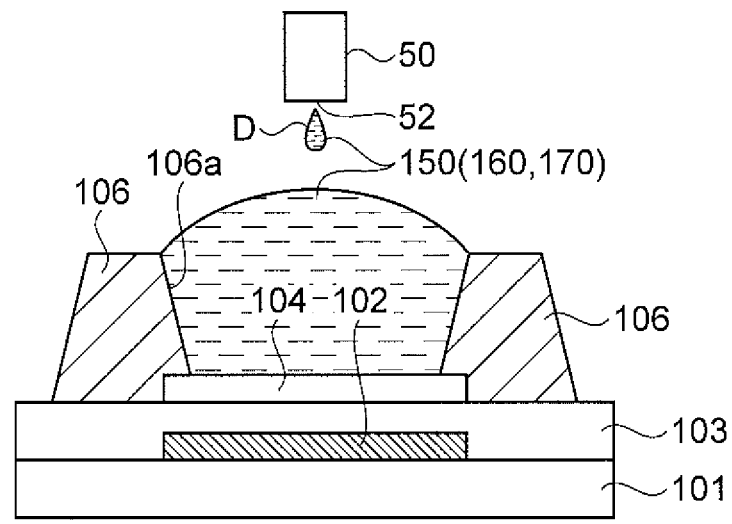
FIG. 4 is a schematic cross-sectional view showing a method for producing an organic EL element.
Figure 5:
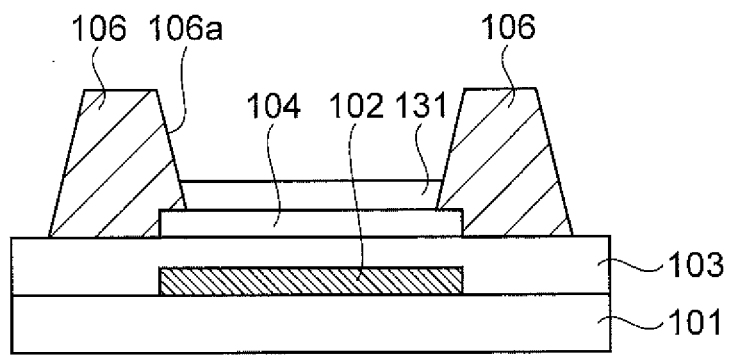
FIG. 5 is a schematic cross-sectional view showing a method for producing an organic EL element.

Next, a method for producing the organic EL element adopting an inkjet method will be described with reference to FIGS. 3, 4, and 5. FIGS. 3, 4, and 5 are schematic cross-sectional views showing a method for forming a functional layer in the organic EL element.

The method for producing the organic EL element 130 includes a partition wall formation step (Step S1), a surface treatment step (Step S2), a functional layer formation step (Step S3), and the like.

In Step S1 (partition wall formation step), as shown in FIG. 3, a photosensitive resin layer is formed on the element substrate 101 having the reflection layer 102 and the pixel electrode 104 formed thereon by applying a photosensitive resin material thereto, followed by drying. Examples of the application method include a transfer method and a slit coating method. The thus formed photosensitive resin layer is exposed to light and developed using an exposure mask corresponding to the shape of the sub-pixels 110, whereby the partition wall 106 which overlaps with the outer edge of the pixel electrode 104, and also forms the opening portion 106a on the pixel electrode 104 is formed.

In Step S2 (surface treatment step), the element substrate 101 on which the partition wall 106 is formed is subjected to a surface treatment. The surface treatment step is performed for the purpose of removing unnecessary materials such as partition wall residues on the surface of the pixel electrode 104 so that the ink composition wets and spreads uniformly in the opening portion 106a surrounded by the partition wall 106 when forming the hole injection layer 131, the hole transport layer 132, and the light-emitting layer 133 constituting the functional layer 136 in the subsequent step. As the surface treatment method, for example, an excimer UV treatment can be applied.

In Step S3, (functional layer formation step), as shown in FIG. 4, an ink 150 containing a hole injection layer material is applied to the opening portion 106a. As the method for applying the ink 150, an inkjet method in which the ink 150 is ejected as an ink droplet (liquid droplet D) from a nozzle 52 of an inkjet head 50 is used. The ejection amount of the liquid droplet D ejected from the inkjet head 50 can be controlled in the picoliter (pl) order, and the liquid droplets D whose number is calculated by dividing a predetermined amount by the ejection amount of the liquid droplet D are ejected into the opening portion 106a. Then, the process proceeds to the drying step.

In the drying step, for example, decompression drying in which the element substrate 101 to which the ink 150 is applied is left under reduced pressure and dried by evaporating the solvent from the ink 150 is used (a decompression drying step). Thereafter, the ink 150 is solidified by performing, for example, a heating firing treatment under atmospheric pressure, whereby the hole injection layer 131 is formed as shown in FIG. 5.

Subsequently, the hole transport layer 132 is formed using an ink 160 containing a hole transport layer material. The method for forming the hole transport layer 132 is also performed by ejecting a predetermined amount of the ink 160 using an inkjet method similarly to the hole injection layer 131. Further, decompression drying and heating firing are performed similarly to the hole injection layer 131, whereby the hole transport layer 132 is formed.

Subsequently, the light-emitting layer 133 is formed using an ink 170 containing a light-emitting layer material. The method for forming the light-emitting layer 133 is also performed by ejecting a predetermined amount of the ink 170 using an inkjet method similarly to the hole injection layer 131. Further, decompression drying and heating firing are performed similarly to the hole injection layer 131, whereby the light-emitting layer 133 is formed. At this time, in consideration of the effect of oxygen, water, or the like on the light-emitting function after decompression drying, for example, it is preferred to solidify the ink by firing in an atmosphere of an inert gas such as nitrogen.

After this step, the electron transport layer 134, the electron injection layer 135, and the counter electrode 105 as a cathode are formed using a gas phase process such as a vacuum deposition method, whereby the organic EL element 130 (FIG. 2) is produced.

In the above-mentioned method for forming the functional layer 136, the hole injection layer 131, the hole transport layer 132, and the light-emitting layer 133 are formed by a liquid phase process (inkjet method), however, one of these layers may be formed by a liquid phase process (inkjet method), and the other layers may be formed by a gas phase process such as vacuum deposition. Further, the electron transport layer 134 and the electron injection layer 135 may be formed by a liquid phase process. (inkjet method).

As described above, in the inkjet method to be used for forming the functional layer 136, the ejection amount of the liquid droplet D is controlled in the picoliter order. Due to this, it is necessary to stably eject the liquid droplet D continuously, and therefore, the ink composition should be a liquid which is homogeneous without causing separation or cloudiness.

Inkjet Head

Figure 6:
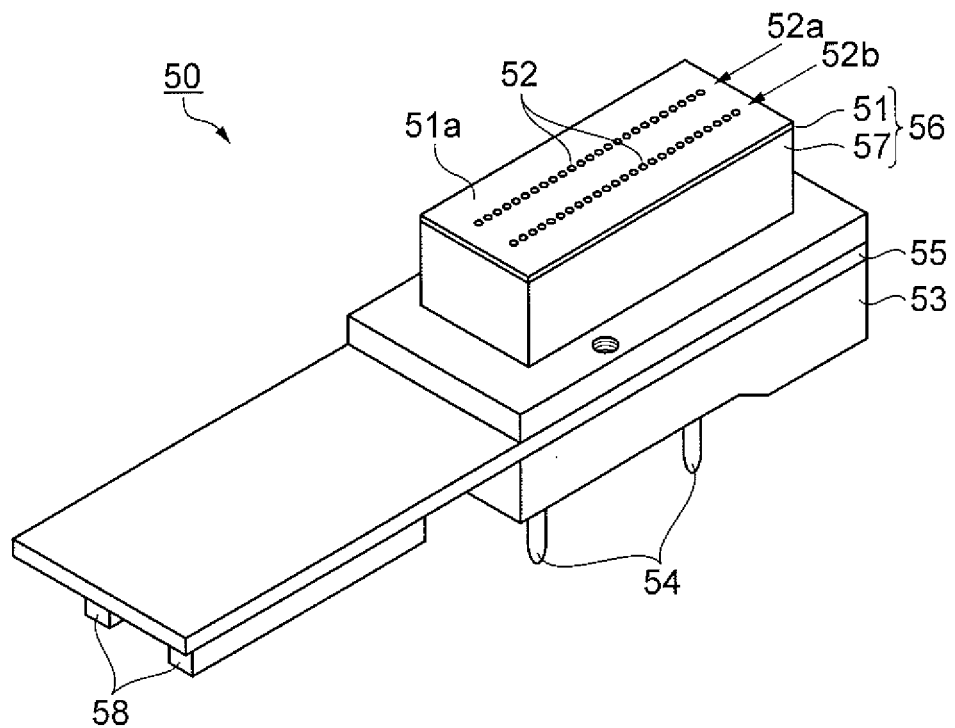
FIG. 6 is a schematic perspective view showing a configuration of an inkjet head.

Next, the outline of the inkjet head according to this embodiment will be described with reference to FIG. 6. FIG. 6 is a schematic perspective view showing a configuration of the inkjet head.

The inkjet head 50 shown in FIG. 6 includes an introduction portion 53, a head substrate 55, a head main body 56, and the like. The introduction portion 53 has a function of an ink introduction portion in the inkjet head 50. In this introduction portion 53, double connection needles 54 are provided. The connection needles 54 are connected to an ink supply mechanism (not shown) through a pipe, and have a function to supply the ink containing the functional layer forming material described above into the inkjet head 50.

The head substrate 55 is placed such that one surface is adjacent to the introduction portion 53 and the other surface faces the head main body 56. Further, in this head substrate 55, double connectors 58 are provided. The connectors 58 form terminals for electrically connecting a circuit substrate (not shown) to the inkjet head 50 through a flexible flat cable (not shown).

The head main body 56 is placed adjacent to the head substrate 55, and a flow channel of the ink introduced from the connection needle 54 is formed therein. This head main body 56 includes a pressurization portion 57, a nozzle plate 51, and the like. In the pressurization portion 57, a piezoelectric element is placed in a cavity portion (not shown) as a driving unit (actuator) of the inkjet head 50. Further, on the surface of the nozzle plate 51, onto which the inkjet head 50 ejects the ink as the liquid droplet D, a nozzle surface 51a is formed. On this nozzle surface 51a, two nozzle rows 52a and 52b in which multiple nozzles 52 are arranged at predetermined intervals are placed in parallel with each other. Since these two nozzle rows 52a and 52b are placed, the inkjet head 50 has a configuration of so-called double nozzle arrangement. Further, the nozzle 52 has a circular shape, and the diameter thereof is set to about 30 µm. The cavity portion is provided for each of these nozzles 52.

According to the above-mentioned configuration, the ink is supplied and filled in the inkjet head 50 from the ink supply mechanism. Subsequently, when a driving signal (electrical signal) is applied to the piezoelectric element in the inkjet head 50 from a head driver (not shown), a volume change occurs in the cavity in the pressurization portion 57 by the deformation of the piezoelectric element. The inkjet head is configured such that by the action of a pump by this volume change, the ink filled in the cavity is pressurized, and therefore is ejected as the liquid droplet D from the nozzle 52.

Here, the driving unit (actuator) placed for each nozzle 52 of the inkjet head 50 is not limited to the piezoelectric element. For example, an electromechanical conversion element which displaces a vibrator plate as the actuator by electrostatic adsorption or an electrothermal conversion element which ejects the ink as an ink droplet by an air bubble generated by heating may also be used. Further, the inkjet head 50 is mounted on a carriage (not shown) which freely reciprocates and therefore is configured to be scannable relative to the element substrate 101 (see FIG. 1).

Ink Containing Functional Layer Forming Material

Next, the ink containing a functional layer forming material (hereinafter also referred to as simply "ink") to be ejected as the liquid droplet D from the above-mentioned inkjet head 50 will be described.

The ink contains a solvent (vehicle) and a functional layer forming material (solid component). As the solvent, multiple types of solvents are blended in combination, and a hydrophobic solvent A, a hydrophilic solvent B, and an amphiphilic solvent C are contained. Among these solvents, as at least one type, a solvent which dissolves the functional layer forming material is used. Further, in the above-mentioned functional layer formation step, in order to ensure the drying time of the liquid droplet D and improve the leveling properties, a solvent having a standard boiling point of 150° C. or higher and 340° C. or lower is used, and it is preferred to contain a solvent having a standard boiling point of about 200° C. or higher in an amount of 10 mass % or more with respect to the total mass of the ink.

As the solvent A, at least one compound selected from aromatic compounds and hydrocarbon-based compounds is used. Specific examples of the aromatic compounds include diisopropylbenzene (DIPB), cyclohexylbenzene (CHB), diphenyl ether (DPE), 3-phenoxytoluene (3PT), and bis(dimethylphenyl)ethane (BDMPE).

Further, examples of the hydrocarbon-based compounds include chain hydrocarbon compounds such as decane, undecane, dodecane, tridecane, tetradecane, pentadecane, and hexadecane, and cyclic hydrocarbon compounds such as naphthene-based compounds. As these hydrocarbon compounds, commercially available products as a mixture can be used as long as the standard boiling point thereof is within the above-mentioned range. Examples thereof include NS Clean (200, 220, 230) (trademark) manufactured by JX Nippon Oil & Energy Corporation, Naphtesol (grade: 160, 200, 220) (trademark) manufactured by JX Nippon Oil &

Energy Corporation, and IP Solvent (1620, 2028) manufactured by Idemitsu Kosan Co., Ltd.

Further, as the solvent A, a chain alcohol having 14 or more carbon atoms may be used. This has an alcoholic hydroxy group, but has hydrophobicity due to the effect of a long-chain hydrocarbon group in the molecular structure so that it can be applied as the solvent A. Specific examples thereof include 7-ethyl-2-methyl-4-undecanol (7E2M4U).

As the solvent B, at least one compound selected from glycol ether-based compounds and alkane diol-based compounds is used. Specific examples of the glycol ether-based compounds include diethylene glycol (DEG), dipropylene glycol (DPG), triethylene glycol (TEG), tetraethylene glycol (TetraEG), triethylene glycol monobutyl ether, diethylene glycol monomethyl ether, triethylene glycol monomethyl ether, diethylene glycol monoisopropyl ether, ethylene glycol monobutyl ether, diethylene glycol monobutyl ether, ethylene glycol monoisobutyl ether, diethylene glycol monoisobutyl ether, ethylene glycol monohexyl ether, diethylene glycol monohexyl ether, ethylene glycol mono-2-ethylhexyl ether, diethylene glycol mono-2-ethylhexyl ether, ethylene glycol monoallyl ether, dipropylene glycol monomethyl ether, dipropylene glycol monopropyl ether, propylene glycol monobutyl ether, and dipropylene glycol monobutyl ether. Further, examples of the alkane diol-based compounds include 1,2-ethanediol (12ED), 1,2-propanediol (12PD), 1,3-butanediol (13BD), 1,4-butanediol (14BD), 2,3-butanediol (23BD), 1,5-pentanediol, 2-methyl-2,4-pentanediol (2M24PD), 1,6-hexanediol, and 2-ethyl-1,3-hexanediol (2E13HD).

As the solvent C, at least one alcohol selected from linear monoalcohols (linear monohydric alcohols) having 8 or more and 13 or less carbon atoms is used. Specific examples of the solvent C include 1-octanol, 1-nonanol, 1-decanol, 1-undecanol, 1-dodecanol, 1-tridecanol, 2-nonanol, and 2-undecanol.

The content ratio of the solvent C is set to 1 mass % or more with respect to the total mass of the ink. By setting the content ratio to 1 mass % or more, the miscibility between the solvent A and the solvent B is improved. The content ratio is more preferably 5 mass % or more so that the miscibility between the solvent A and the solvent B is further improved.

Here, the viscosity of the solvent B at normal temperature is desirably higher than that of the solvent A. Further, the viscosity of the solvent B is desirably 20 mPa·s (sec) or more. By setting the viscosity of the solvent B higher than that of the solvent A, when the liquid droplet D is dried to form the functional layer, the fluidity of the liquid droplet D decreases, and thus, it becomes possible to effectively suppress a coffee stain phenomenon. As a result, the leveling properties are improved, and thus, it becomes easy to form a flat film. Incidentally, the normal temperature is defined as a temperature of 5° C. or higher and 35° C. or lower (JIS Z 8703).

In addition, the viscosity of the ink at 23° C. is preferably 1 mPa·s (sec) or more and 10 mPa·s (sec) or less. If the viscosity is 1 mPa·s or more, the ejection stability when the ink is ejected from the inkjet head 50 as the liquid droplet D is ensured. Further, by setting the viscosity to 10 mPa·s or less, the ejected mass of the liquid droplet D is ensured, and the coverage with the ink in the opening portion 106a (see FIG. 4) is improved. The viscosity is more preferably 5 mPa·s or less so that the coverage is further improved.

In the measurement of the viscosity of the solvent and the ink, a viscoelasticity tester MCR 302 (manufactured by Anton Paar Company) is used, and the measurement is performed by adjusting the temperature of the ink or the solvent to 23° C. Specifically, the measurement can be performed by sequentially increasing the shear rate from 10 to 1000 and reading the viscosity when the shear rate is 200.

Next, the functional layer forming material for forming the above-mentioned hole injection layer 131, hole transport layer 132, and light-emitting layer 133 (see FIG. 2) by an inkjet method will be described.

Examples of the functional layer forming material include a hole injection layer material, a hole transport layer material, and a light-emitting layer material. A preferred hole injection or transport layer material for forming the hole injection layer 131 or the hole transport layer 132 is not particularly limited, however, various types of p-type high-molecular materials and various types of p-type low-molecular materials can be used alone or in combination.

Examples of the p-type high-molecular materials (organic polymers) include aromatic amine-based compounds having an arylamine skeleton such as polyarylamines including poly(2,7-(9,9-di-n-octylfluorene)-(1,4-phenylene-((4-sec-butylphenyl)imino)-1,4-phenylene (TFB) and the like, polyfluorene derivatives (PF) having a fluorene skeleton such as a fluorene-bithiophene copolymer and polyfluorene derivatives (PF) having both of an arylamine skeleton and a fluorene skeleton such as a fluorene-arylamine copolymer, poly(N-vinylcarbazole) (PVK), polyvinyl pyrene, polyvinyl anthracene, polythiophene, polyalkylthiophene, polyhexylthiophene, poly(p-phenylene vinylene) (PPV), polythienylene vinylene, a pyrene formaldehyde resin, an ethylcarbazole formaldehyde resin and derivatives thereof, polysilane-based compounds such as polymethylphenylsilane (PMPS), poly[bis(4-phenyl)(2,4,6-trimethylphenyl)amine (PTTA), and poly[N,N'-bis(4-butylphenyl)-N,N'-bis(phenyl)-benzidine].

Such a p-type high-molecular material can also be used as a mixture with another compound. For example, as a mixture containing polythiophene, poly(3,4-ethylenedioxythiophene)/polystyrene sulfonic acid) (PEDOT/PSS), an electrically conductive polymer VERAZOL (trademark) manufactured by Soken Chemical & Engineering Co., Ltd. or the like, and ELsource (trademark) manufactured by Nissan Chemical Industries, Ltd. as polyaniline can be used.

Examples of the p-type low-molecular materials include arylcycloalkane-based compounds such as 1,1-bis(4-di-para-tolylaminophenyl)cyclohexane and 1,1'-bis(4-di-para-tolylaminophenyl)-4-phenyl-cyclohexane (TAPC), arylamine-based compounds such as 4,4',4''-trimethyltriphenylamine, N,N'-diphenyl-N,N'-bis(3-methylphenyl)-1,1'-biphenyl-4,4'-diamine (TPD), N,N,N',N'-tetraphenyl-1,1'-biphenyl-4,4'-diamine, N,N'-diphenyl-N,N'-bis(3-methylphenyl)-1,1'-biphenyl-4,4'-diamine (TPD1), N,N'-diphenyl-N,N'-bis(4-methoxyphenyl)-1,1'-biphenyl-4,4'-diamine (TPD2), N,N,N',N'-tetrakis(4-methoxyphenyl)-1,1'-biphenyl-4,4'-diamine (TPD3), N,N'-bis(1-naphthyl)-N,N'-diphenyl-1,1'-biphenyl-4,4'-diamine (α-NPD), a triphenylamine tetramer (TPTE), 1,3,5-tris[4-(diphenylamino)benzene (TDAPB), tris(4-(carbazol-9-yl)phenyl)amine (spiro-TAD), tris-para-tolylamine (HTM1), 1,1-bis[(di-4-tolylamino)phenyl]cyclohexane (HTM2), and N4,N4'-(biphenyl-4,4'-diyl)bis(N4,N4',N4'-triphenylbiphenyl-4,4'-diamine) (TPT1), phenylenediamine-based compounds such as N,N,N',N'-tetraphenyl-para-phenylenediamine, N,N,N',N'-tetra(para-tolyl)-para-phenylenediamine, N,N,N',N'-tetra(meta-tolyl)-meta-phenylenediamine (PDA), PDA-Si (Mol. Cryst. Liq. Cryst. Vol. 462. pp. 249-256, 2007), and N,N'-diphenyl-1,4-phenylenediamine (DPPD), carbazole-based compounds such as carbazole, N-isopropylcarbazole, N-phenylcarbazole, and VB-TCA (Adv. Mater. 2007, 19, 300-304), stilbene-based compounds such as stilbene and 4-di-para-tolylaminostilbene, oxazole-based compounds such as OxZ, triphenylmethane-based compounds such as triphenylmethane, 4,4',4"-tris(N-3-methylphenyl-N-phenylamino)triphenylamine (m-MTDATA), 4,4',4"-tris(N,N-(2-naphthyl)phenylamino)triphenylamine (2-TNATA), and 4,4',4"-tri(N-carbazolyl)triphenylamine (TCTA), pyrazoline-based compounds such as 1-phenyl-3-(para-dimethylaminophenyl)pyrazoline, benzine(cyclohexadiene)-based compounds, triazole-based compounds such as triazole, imidazole-based compounds such as imidazole, oxadiazole-based compounds such as 1,3,4-oxadiazole and 2,5-di(4-dimethylaminophenyl)-1,3,4-oxadiazole, anthracene-based compounds such as anthracene and 9-(4-diethylaminostyryl)anthracene, fluorenone-based compounds such as fluorenone, 2,4,7-trinitro-9-fluorenone, and 2,7-bis(2-hydroxy-3-(2-chlorophenylcarbamoyl)-1-naphthylazo) fluorenone, aniline-based compounds such as polyaniline, silane-based compounds, pyrrole-based compounds such as 1,4-dithioketo-3,6-diphenyl-pyrrolo-(3,4-c)pyrrolopyrrole, fluorene-based compounds such as fluorene, porphyrin-based compounds such as porphyrin and metal tetraphenyl porphyrins, quinacridone-based compounds such as quinacridone, metal or non-metal phthalocyanine-based compounds such as phthalocyanine, copper phthalocyanine (CuPc), tetra(t-butyl) copper phthalocyanine, and iron phthalocyanine, metal or non-metal naphthalocyanine-based compounds such as copper naphthalocyanine, vanadyl naphthalocyanine, and monochloro gallium naphthalocyanine, and benzidine-based compounds such as N,N'-di(naphthalen-1-yl)-N,N'-diphenyl-benzidine and N,N,N',N'-tetraphenylbenzidine. Incidentally, PDA-Si is used by adding a cationic polymerizable compound: xylene bisoxetane (ARONE OXETANE OXT-121, Toagosei Co., Ltd.) and a radical polymerization initiator: an aliphatic diacyl peroxide (PEROYL L, NOF Corporation) in order to achieve polymerization.

Next, a light-emitting layer material from which fluorescence or phosphorescence is obtained will be described by showing specific examples for each light emission color.

Red Light-Emitting Material

A red light-emitting material is not particularly limited, and various types of red fluorescent materials and red phosphorescent materials can be used alone or two or more types thereof can be used in combination.

The red fluorescent material is not particularly limited as long as it emits red fluorescence, and examples thereof include perylene derivatives, europium complexes, benzopyran derivatives, rhodamine derivatives, benzothioxanthene derivatives, porphyrin derivatives, nile red, 2-(1,1-dimethylethyl)-6-(2-(2,3,6,7-tetrahydro-1,1,7,7-tetramethyl-1H,5H-benzo(ij)quinolizin-9-yl)ethenyl)-4H-pyran-4H-ylidene)propanedinitrile (DCJTB), 4-(dicyanomethylene)-2-methyl-6-(p-dimethylaminostyryl)-4H-pyran (DCM), poly[2-methoxy-5-(2-ethylhexyloxy)-1,4-(1-cyanovinylenephenylene)], poly[{9,9-dihexyl-2,7-bis(1-cyanovinylene)fluorenylene}-alt-co-{2,5-bis(N,N'-diphenylamino)-1,4-phenylene}], and poly[{2-methoxy-5-(2-ethylhexyloxy)-1,4-(1-cyanovinylenephenylene)}-co-{2,5-bis(N,N'-diphenylamino)-1,4-phenylene}].

The red phosphorescent material is not particularly limited as long as it emits red phosphorescence, and examples thereof include metal complexes such as complexes of iridium, ruthenium, platinum, osmium, rhenium, and palladium, and metal complexes in which at least one of the ligands of such a metal complex has a phenylpyridine skeleton, a bipyridyl skeleton, a porphyrin skeleton, or the like. More specific examples thereof include tris(1-phenylisoquinoline)iridium, bis[2-(2'-benzo[4,5-α]thienyl) pyridinato-N,C3']iridium (acetylacetonate) (Btp2Ir(acac)), 2,3,7,8,12,13,17,18-octaethyl-12H,23H-porphyrin-platinum (II), bis(2-(2'-benzo[4,5-a]thienyl)-pyridinato-N,C3') iridium, and bis(2-phenylpyridine)iridium (acetylacetonate).

Further, the red light-emitting layer 133 may contain, in addition to the above-mentioned red light-emitting material, a host material to which the red light-emitting material is added as a guest material.

The host material has a function to generate an exciton by recombining a hole and an electron with each other, and also to excite the red light-emitting material by transferring the energy of the exciton to the red light-emitting material (Forster transfer or Dexter transfer). In the case where such a host material is used, for example, the red light-emitting material which is the guest material can be used by doping the host material with the red light-emitting material as a dopant.

Such a host material is not particularly limited as long as it has a function as described above for the red light-emitting material to be used, however, in the case where the red light-emitting material contains a red fluorescent material, examples thereof include acene derivatives (acene-based materials) such as naphthacene derivatives, naphthalene derivatives, and anthracene derivatives, distyrylarylene derivatives, perylene derivatives, distyrylbenzene derivatives, distyrylamine derivatives, quinolinolate-based metal complexes (BAql) such as tris(8-quinolinolato)aluminum complex (Alq3), triarylamine derivatives (TDAPB) such as triphenylamine tetramers, oxadiazole derivatives, silole derivatives (SimCP and UGH3), dicarbazole derivatives (CBP, mCP, CDBP, and DCB), oligothiophene derivatives, benzopyran derivatives, triazole derivatives, benzoxazole derivatives, benzothiazole derivatives, quinoline derivatives, and 4,4'-bis(2,2'-diphenylvinyl)biphenyl (DPVBi), and phosphorus derivatives (PO6). Among these, it is possible to use one type or two or more types in combination.

In the case where the red light-emitting material (guest material) and the host material as described above are used, the content (doping amount) of the red light-emitting material in the red light-emitting layer 133 is preferably from 0.01 to 10 mass %, more preferably from 0.1 to 5 mass %. By setting the content of the red light-emitting material within such a range, the light emission efficiency can be optimized.

Green Light-Emitting Material

A green light-emitting material is not particularly limited, and examples thereof include various types of green fluorescent materials and green phosphorescent materials, and among these, it is possible to use one type or two or more types in combination.

The green fluorescent material is not particularly limited as long as it emits green fluorescence, and examples thereof include coumarin derivatives, quinacridone and derivatives thereof, 9,10-bis[(9-ethyl-3-carbazole)-vinylenyl]-anthracene, poly(9,9-dihexyl-2,7-vinylenefluorenylene), poly[(9,9-dioctylfluoren-2,7-diyl)-co-(1,4-diphenylene-vinylene-2-methoxy-5-{2-ethylhexyloxy}benzene)], poly[(9,9-dioctyl-2,7-divinylenefluorenylene)-alt-co-(2-methoxy-5-(2-ethoxylhexyloxy)-1,4-phenylene)], and poly[(9,9-dioctylfluoren-2,7-diyl)-alt-co-(1,4-benzo-{2,1',3}-thiadiazole)] (F8BT).

The green phosphorescent material is not particularly limited as long as it emits green phosphorescence, and examples thereof include metal complexes such as metal complexes of iridium, ruthenium, platinum, osmium, rhenium, and palladium, and specific examples thereof include fac-tris(2-phenylpyridine)iridium (Ir(ppy)3), bis(2-phenylpyridinato-N,C2')iridium (acetylacetonate), and fac-tris [5-fluoro-2-(5-trifluoromethyl-2-pyridine)phenyl-C,N] iridium.

Further, the green light-emitting layer 133 may contain, in addition to the above-mentioned green light-emitting material, a host material to which the green light-emitting material is added as a guest material.

As such a host material, the same host materials as those described for the above-mentioned red light-emitting layer 133 can be used.

Blue Light-Emitting Material

Examples of a blue light-emitting material include various types of blue fluorescent materials and blue phosphorescent materials, and among these, it is possible to use one type or two or more types in combination.

The blue fluorescent material is not particularly limited as long as it emits blue fluorescence, and examples thereof include distyrylamine derivatives such as distyryldiamine-based compounds, fluoranthene derivatives, pyrene derivatives, perylene and perylene derivatives, anthracene derivatives, benzoxazole derivatives, benzothiazole derivatives, benzoimidazole derivatives, chrysene derivatives, phenanthrene derivatives, distyrylbenzene derivatives, tetraphenylbutadiene, 4,4'-bis(9-ethyl-3-carbazovinylene)-1,1'-biphenyl (BCzVBi), poly[(9,9-dioctylfluoren-2,7-diyl)-co-(2, 5-dimethoxybenzen-1,4-diyl)], poly[(9,9-dihexyloxyfluoren-2,7-diyl)-alt-co-(2-methoxy-5-{2-ethoxylhexyloxy}phenylen-1,4-diyl)], poly[(9,9-dioctylfluoren-2,7-diyl)-co-(ethynylbenzene)], and poly[(9, 9-dioctylfluoren-2,7-diyl)-co-(N,N'-diphenyl)-N,N'-di(para-butylphenyl)-1,4-diamino-benzene]].

The blue phosphorescent material is not particularly limited as long as it emits blue phosphorescence, and examples thereof include metal complexes such as complexes of iridium, ruthenium, platinum, osmium, rhenium, and palladium, and specific examples thereof include bis[4,6-difluorophenylpyridinato-N,C2']-picolinate-iridium (FIrpic), tris (1-phenyl-3-methylbenzimidazolin-2-ylidene-C,C2') (Ir (pmb)3), bis(2,4-difluorophenylpyridinato)(5-(pyridin-2-yl)-1H-tetrazole)iridium (FIrN4), tris[2-(2,4-difluorophenyl)pyridinato-N,C2']iridium, bis[2-(3,5-trifluoromethyl)pyridinato-N,C2']-picolinate-iridium, and bis(4,6-difluorophenylpyridinato-N,C2')iridium (acetylacetonate).

Further, the blue light-emitting layer 133 may contain, in addition to the above-mentioned blue light-emitting material, a host material to which the blue light-emitting material is added as a guest material.

As such a host material, the same host materials as those described for the above-mentioned red light-emitting layer 133 can be used.

Further, also for an electron injection or transport layer material to be used for forming the electron transport layer 134 or the electron injection layer 135, a functional layer forming material which can be dissolved in the solvent A or the solvent B is selected, and the layer can be formed by the inkjet method in the same manner as described above.

Examples of the electron injection or transport layer material include quinoline derivatives of organic metal complexes having 8-quinolinol or a derivative thereof as a ligand such as tris(8-quinolilato)aluminum (Alq3), mixed materials of 4,4',4"-tris(diphenylphosphinyl)-triphenylphosphine oxide (hereinafter abbreviated as "TPPO-Burst") described in JP-A-2007-281039 and cesium carbonate, oxadiazole derivatives, perylene derivatives, pyridine derivatives, pyrimidine derivatives, quinoxaline derivatives, diphenylquinone derivatives, and nitro-substituted fluorene derivatives, and among these, it is possible to use one type or two or more types in combination.

In this embodiment, the low-molecular material refers to a material having a molecular weight or a weight average molecular weight of less than 1000, and the high-molecular material refers to a material having a molecular weight or a weight average molecular weight of 1000 or more and having a structure with a repeated basic skeleton.

The content of the functional layer forming material (the concentration of the solid component) in the ink can be arbitrarily set as long as the viscosity of the ink at 23° C. is within the above-mentioned range. In the case where the functional layer forming material is a low-molecular material, even when it is added to the ink, the viscosity hardly increases, and therefore, there is no upper limit on the concentration of the solid component with respect to the viscosity of the ink. Further, in the case where the functional layer forming material is a high-molecular material, the viscosity increases, and the degree of the increase in the viscosity has a correlation with the weight average molecular weight of the high-molecular material. Therefore, it is preferred that the concentration of the solid component of the high-molecular material is 0.1 mass % or more and 5 mass % or less in the case where the weight average molecular weight is less than 100,000, and is 0.1 mass % or more and 3 mass % or less in the case where the weight average molecular weight is 100,000 or more.

With respect to the material constituting the ink described above, the functional layer forming material is selected according to the solvent and the functional layer to be formed, and the ink is prepared.

Method for Evaluating Miscibility of Solvents

Figure 7:
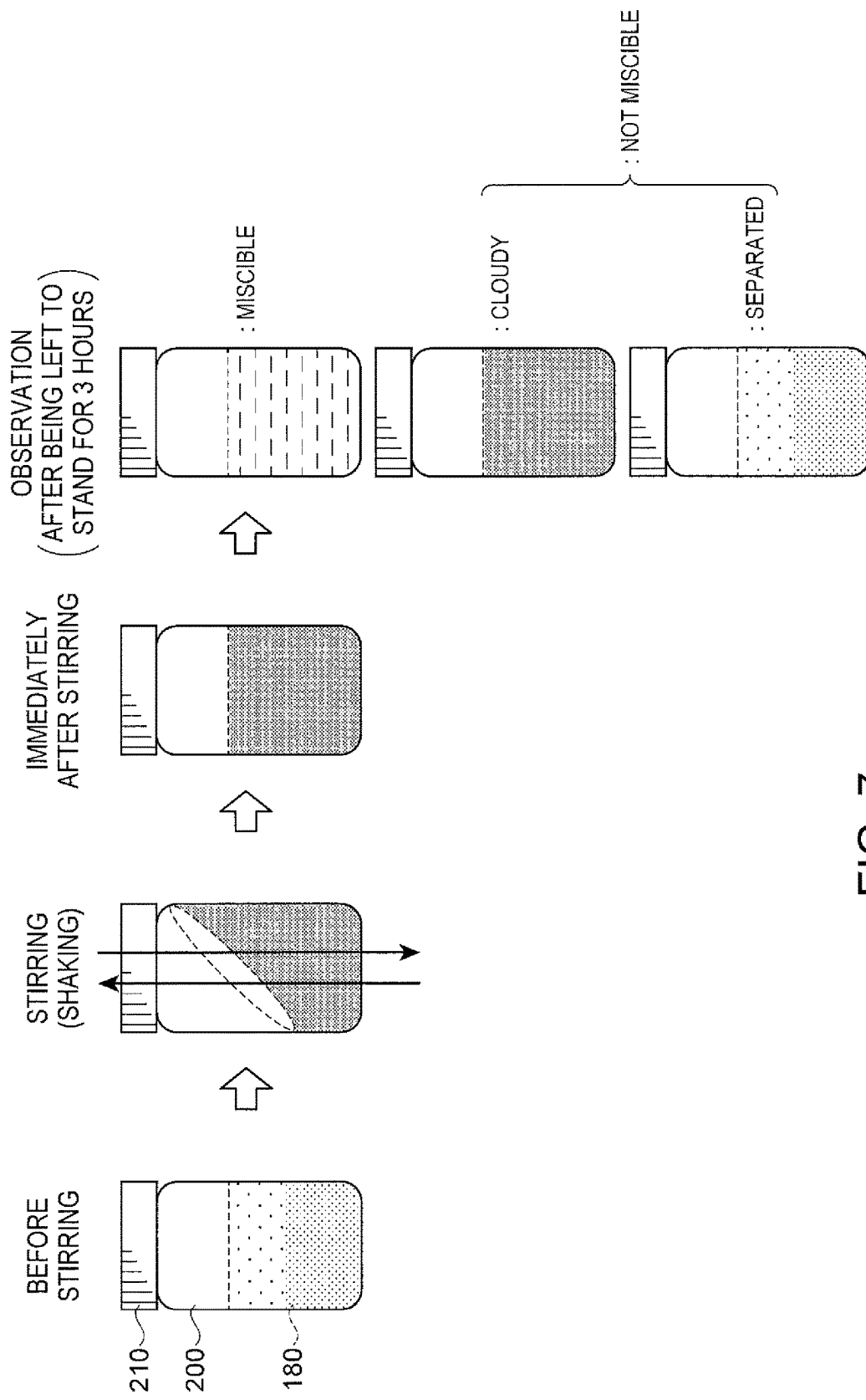
FIG. 7 is a schematic view showing a procedure of a method for evaluating miscibility.

Next, a method for evaluating the miscibility of the solvents in the ink will be described with reference to FIG. 7. FIG. 7 is a schematic view showing a procedure of a method for evaluating the miscibility of the solvents.

First, as the ink of this embodiment, an ink 180 was used. The ink 180 has a composition excluding the functional layer forming material for confirming the miscibility of the solvents. In the composition of the ink 180, as the aromatic compound of the solvent A, 3-phenoxytoluene, and as the hydrocarbon-based compound of the solvent A, dodecane were selected, as the glycol ether-based compound of the solvent B, diethylene glycol, and as the alkane diol-based compound of the solvent B, 1,6-hexanediol were selected, and as the solvent C, 1-octanol was selected. The content ratios of the respective components were set as follows: 3-phenoxytoluene: 25 mass %, dodecane: 25 mass %, diethylene glycol: 25 mass %, 1,6-hexanediol: 24 mass %, and 1-octanol: 1 mass %.

Subsequently, with respect to the above-mentioned respective solvents, 3-phenoxytoluene: 5.0 g, dodecane: 5.0 g, diethylene glycol: 5.0 g, 1,6-hexanediol: 4.8 g, and 1-octanol: 0.2 g were placed in a glass tube bottle 200 (internal volume: about 22 mL), and the bottle was closed with a lid 210.

Subsequently, the glass tube bottle 200 was held in the hand and shaken, whereby the respective components of the ink 180 were stirred. The shaking conditions were set as follows: shaking width: about 20 cm (in the vertical direction), and shaking rate: about 100 times/min. Here, the shaking conditions may be any conditions as long as the shaking width is 15 cm or more and 25 cm or less, and the shaking rate is 50 times/min or more and 150 times/min or less. The stirring may be performed using a shaking device, a magnetic stirrer using a stirring bar, or the like.

Thereafter, the glass tube bottle 200 after shaking was left to stand. Immediately after stirring (shaking), minute air bubbles may sometimes be mixed in the ink 180. At the time point when the elapsed time from the start of being left to stand was 3 hours, the presence or absence of the occurrence of separation or cloudiness in the ink 180 was visually observed. At this time, when the miscibility of the solvents is poor, separation (phase separation) or cloudiness may sometimes occur in the solvents. It was confirmed that separation or cloudiness did not occur in the ink 180 and the miscibility was favorable.

The above evaluation was performed in a room in which the temperature was regulated at about 23° C. In addition, the miscibility may be evaluated in more detail by performing observation also at the time point when the elapsed time is less than 3 hours or exceeds 3 hours.

Here, the volume of the glass tube bottle 200 to be used in the evaluation is not particularly limited, but is preferably 10 mL or more from the viewpoint of ease of observation of the miscibility, and is preferably 50 mL or less in order to save the ink 180. Further, the material of the glass tube bottle 200 is not limited to glass, and for example, a container made of a resin may be used. In addition, the amount of the ink 180 to be placed in the glass tube bottle 200 is preferably 40 vol % or more and 90 vol % or less with respect to the internal volume of the glass tube bottle 200.

As described above, with the use of the ink according to this embodiment, the following effects can be obtained.

According to the ink of this embodiment, the miscibility between the solvents having different polarities is improved, and therefore, it is possible to increase the combination of the types of solvents which can be blended together. More specifically, in the case of the ink of the related art, when solvents having different polarities are blended in combination in the ink, separation or cloudiness may sometimes occur. On the other hand, according to this embodiment, by blending a monohydric alcohol having 8 or more carbon atoms in an amount of 1 mass % or more with respect to the total mass of the ink, even if a hydrophobic solvent and a hydrophilic solvent are blended in combination, the above alcohol which is amphiphilic is interposed between both solvents, and therefore, the occurrence of separation or cloudiness can be suppressed. According to this, the choice of solvents which can adjust the ink properties such as viscosity can be further increased.

In addition, it becomes possible to combine multiple solvents having different viscosities, polarities, or the like, and therefore, it becomes easy to ensure the ink physical properties which are required for the ink for use in an inkjet method, the drying properties, leveling properties, and the like. According to this, an ink which has superior ink physical properties and ink characteristics to those of the inks of the related art and is favorable for an inkjet method can be provided.

Moreover, since the choice of solvents is expanded as compared with the related art, it becomes easy to deal with environmental compatibility, safety, cost reduction, etc. while ensuring the ink physical properties and characteristics.

Hereinafter, with respect to the ink of this embodiment, Examples and Comparative Examples for which the miscibility of solvents was evaluated are shown, and the effect of this embodiment will be described in more specifically.

Solvents

FIG. 8 is a chart showing the viscosities at 23° C. (the viscosities at 40° C. of some solvents) and the standard boiling points of part of the solvents listed in the above embodiment. Solvents were selected from the solvents shown in FIG. 8, and evaluation of Examples and Comparative Examples was performed. In Table of FIG. 8, the solvents are indicated by abbreviations as follows: diisopropylbenzene: "DIPB", cyclohexylbenzene: "CHB", diphenyl ether: "DPE", 3-phenoxytoluene: "3PT", bis(dimethylphenyl)ethane: "BDMPE"; 7-ethyl-2-methyl-4-undecanol: "7E2M4U", diethylene glycol: "DEG", dipropylene glycol: "DPG", triethylene glycol: "TEG", tetraethylene glycol: "TetraEG", 2,3-butanediol: "23BD", 1,2-propanediol: "12PD", 1,2-ethanediol: "12ED", 2-methyl-2,4-pentanediol: "2M24PD", 1,3-butanediol: "13BD", 1,4-butanediol: "14BD", and 2-ethyl-1,3-hexanediol: "2E13HD".

Composition of Ink

FIGS. 9, 10, 11, and 12 are charts showing the compositions of solvents of inks for evaluation of Examples and Comparative Examples. In the cases shown in FIG. 9 (examples of combination of solvents from No. 1 to No. 35), as the solvent C, 1-octanol was used as a primary alcohol having 8 carbon atoms. Similarly, in the cases shown in FIG. 10 (examples of combination of solvents from No. 36 to No. 70), 2-nonanol was used as a secondary alcohol having 9 carbon atoms, in the cases shown in FIG. 11 (examples of combination of solvents from No. 71 to No. 105), 1-nonanol was used as a primary alcohol having 9 carbon atoms, and in the cases shown in FIG. 12 (examples of combination of solvents from No. 106 to No. 110), 1-nonanol was used as a primary alcohol having 9 carbon atoms. Further, in these tables, the names of some compounds are indicated by the same abbreviations as those in FIG. 8 as described above. Incidentally, in the inks for evaluation of Examples and Comparative Examples, in the same manner as the inks for evaluation of the above-mentioned embodiment, the functional layer forming material is not blended, however, when the functional layer forming material is dissolved in the compositions of the solvents, it becomes easy to form a flat film in which a coffee stain phenomenon is suppressed.

The aromatic compound to be contained in the solvent A is represented by A1, the hydrocarbon-based compound or the like to be contained therein is represented by A2, and in FIGS. 9, 10, and 11, A1 and A2 were mixed at a mass ratio of 1:1, whereby the solvent A was prepared. Similarly, the alkane diol-based compound to be contained in the solvent B is represented by B1, the glycol ether-based compound to be contained therein is represented by B2, and B1 and B2 were mixed at a mass ratio of 1:1, whereby the solvent B was prepared. Further, in FIG. 12, A1 and A2, or E1 and B2 were not mixed, and the solvent was used singly. Specifically, in the solvents A of No. 107 to No. 110, A1 and A2 were not mixed, and only either one of A1 and A2 was blended. Further, in the solvents B of No. 106 to No. 110, B1 and B2 were not mixed, and only either one of B1 and B2 was blended.

Inks for evaluation were prepared using the above-mentioned solvents by setting the mass ratio of the solvent A to the solvent B to 50:49, 50:48, 50:40, 55:35, and 40:50 in Examples, 50:50 and 50:49.5 in Comparative Examples and supplementing the remainder with the solvent C to make the total 100. Incidentally, in the examples of combination of solvents of No. 106 to No. 110 (FIG. 12), inks for evaluation were prepared by setting the mass ratio of the solvent A to the solvent B to 45:50 in place of 40:50 in Examples. That is, the content ratio of the solvent C with respect to the total mass of the ink was set to 1 mass % or more and 10 mass % or less in Examples, 0 mass % (free of the solvent C) and 0.5 mass % in Comparative Examples. The numbers (Nos.) shown in the left end column of the respective charts in FIGS. 9, 10, 11, and 12 correspond to the numbers (Nos.) in the charts of the results of evaluation shown below.

Evaluation of Miscibility

With respect to the above-mentioned inks for evaluation of Examples and Comparative Examples, the miscibility of the solvents was evaluated in the same manner as in the above-mentioned embodiment. The results are shown in FIGS. 13, 14, 15, and 16. As described above, the numbers (Nos.) shown in the left end column of the respective charts in FIGS. 13, 14, 15, and 16 correspond to the numbers (Nos.) in FIGS. 9, 10, 11, and 12, respectively, and the results of the evaluation for the compositions of the solvents are shown. Further, in the tables, the case where separation and cloudiness did not occur and the solvents were miscible with each other was evaluated as "A (favorable)", and the case where separation or cloudiness occurred was evaluated as "B (not favorable)". Incidentally, the results of evaluation of Comparative Examples in which the content of the solvent C was 0 mass % (not contained) are shown only in FIG. 13.

As shown in FIGS. 13, 14, 15, and 16, in Examples, it was shown that as long as the solvent C is contained in an amount of 1 mass % or more, the miscibility between the solvent A and the solvent B is excellent at any mixing ratio.

On the other hand, in Comparative Examples, it was shown that in the inks in which the solvent C is not contained and also in the inks in which the content ratio of the solvent C is 0.5 mass %, the solvent A and the solvent B are not miscible with each other, and separation or cloudiness occurs, and thus, the miscibility is poor as compared with the inks of Examples.

The invention is not limited to the above-mentioned embodiments, and appropriate modifications are possible without departing from the gist or idea of the invention readable from the appended claims and the entire specification. An ink (ink composition) thus modified is also included in the technical scope of the invention. Other than the above-mentioned embodiments, various modification examples can be made. Hereinafter, modification examples will be described.

Modification Example 1

In the above-mentioned embodiments, the ink containing the functional layer forming material for forming the functional layer of the organic EL element has been described, however, the ink according to the invention can also be applied to an ink containing a color material for forming (printing) an image or the like on an ejection target material (recording medium).

As the ink containing a color material, for example, a non-aqueous soft solvent ink for a recording medium made of vinyl chloride can be exemplified. Such an ink was configured to contain a hydrophilic solvent such as a glycol ether-based compound or a cyclic ester-based compound as a main component, and contain at least one material selected from an organic pigment, an inorganic pigment, and an oil-soluble dye as the color material, and a fixing resin, other additives, and the like in the past. By applying the ink according to the invention thereto, it becomes possible to add a hydrophobic solvent.

As the solvent B, for example, in addition to the glycol ether-based compounds exemplified in the above-mentioned embodiment, glycol diethers such as diethylene glycol methyl ethyl ether, diethylene glycol diethyl ether, diethylene glycol butyl methyl ether, diethylene glycol dibutyl ether, triethylene glycol dimethyl ether, tripropylene glycol dimethyl ether, and tetraethylene glycol dimethyl ether may be used, and among these, one type or two or more types in combination may be used. In addition, as another hydrophilic solvent, for example, a cyclic ester-based compound such as γ-butyrolactone can also be added. As the solvent A and the solvent C, those exemplified in the above-mentioned embodiment can be used.

Further, as the fixing resin, it is preferred to use at least one resin selected from a vinyl chloride resin, a vinyl acetate resin, a cellulose acetate butyrate resin, an acrylic resin, a styrene acrylic resin, and the like, so that the abrasion resistance of a printed area (image) is improved. The content ratio of the fixing resin with respect to the total amount of the ink is preferably 0.1 mass % or more and 10 mass % or less. By setting the content ratio of the fixing resin within the above range, the fixing properties and abrasion resistance of a printed material are improved while suppressing the increase in the viscosity of the ink.

According to this modification example, by using a hydrophobic solvent in a soft solvent ink, the drying time of a printed material is reduced, and a working time can be reduced as compared with the ink of the related art. More specifically, by including the solvent C, the hydrophobic solvent A can be added, and the polarity of the ink is decreased as compared with the related art, and thus, the hygroscopicity of the ink is suppressed. When the hygroscopicity of the ink is suppressed, on a recording medium, while the ink droplet is dried, absorption of moisture of the solvent remaining in the liquid droplet is suppressed. Due to this, the solvent is less likely to absorb moisture to retard volatilization. In addition, the solvent A having a lower standard boiling point than that of the solvent B can be used, and therefore, the drying properties of the ink droplet are further improved. As a result, the drying waiting time for the subsequent step (taking up or eyelet processing, etc.) can be reduced, and it becomes possible to transfer to the subsequent step in a short time. That is, a soft solvent ink capable of reducing the working time from printing to drying can be provided.

Further, the ink of this modification example may be a clear ink containing a light transmissive resin which does not contain a color material. The clear ink is used for the purpose of protecting a printed area by covering the surface of the printed area with a light transmissive resin, or other purposes. By using the ink of this modification example as a clear ink, the drying time of the clear ink is reduced. According to this, a protective coating film can be promptly formed.

Modification Example 2

The ink according to the invention can also be applied to, for example, an ink for a color filter of a liquid crystal display device as the ink containing a color material other than the above-mentioned modification example. A color filter generally includes a colored layer of multiple different colors (a colored filter of three colors corresponding to RGB). In order to form this colored layer, an ink for a color filter is used. As a color material for forming the colored layer, existing pigments or dyes can be used.

According to this modification example, it becomes possible to blend multiple solvents having different viscosities or polarities in combination. Therefore, in the ink for a color filter, the drying properties and leveling properties can be improved. As a result, an ink for a color filter capable of forming a smooth colored layer in a short time can be provided.

Modification Example 3

In the above-mentioned embodiments, the ink for forming the functional layer (organic semiconductor layer) by an inkjet method has been described by showing the organic EL element as an example, however, the ink according to the invention can also be applied to the formation of an element including an organic semiconductor layer other than the organic EL element. Examples of the element including other organic semiconductor layer include elements such as organic field-effect transistors and organic solar cells. By applying the ink according to the invention thereto, the choice of solvents to be used in the ink is expanded, and thus, the properties suitable for forming the organic semiconductor layer by an inkjet method can be imparted to the ink.

The entire disclosure of Japanese Patent Application No. 2015-222779, filed Nov. 13, 2015 is expressly incorporated by reference herein.

What is claimed is:

1. An ink composition comprising:
   a solid component;
   a hydrophobic solvent A that contains at least one compound selected from aromatic compounds and hydrocarbon-based compounds;
   a hydrophilic solvent B that contains at least one compound selected from glycol ether-based compounds and alkane diol-based compounds; and
   an amphiphilic solvent C,
   wherein:
   the solvent C is a monohydric alcohol having 8 or more carbon atoms, and
   the viscosity of the solvent A at normal temperature is lower than that of the solvent B.

2. The ink composition according to claim 1, wherein
   the solvent A contains at least one compound selected from aromatic compounds and at least one compound selected from hydrocarbon-based compounds, and
   the solvent B contains at least one compound selected from glycol ether-based compounds and at least one compound selected from alkane diol-based compounds.

3. The ink composition according to claim 1, wherein
   the aromatic compounds are diisopropylbenzene, cyclohexylbenzene, diphenyl ether, 3-phenoxytoluene, and bis(dimethylphenyl)ethane, and
   the hydrocarbon-based compounds are decane, undecane, dodecane, tridecane, tetradecane, pentadecane, and hexadecane.

4. The ink composition according to claim 1, wherein
   the glycol ether-based compounds are diethylene glycol, triethylene glycol, dipropylene glycol, and tetraethylene glycol, and
   the alkane diol-based compounds are 1,2-ethanediol, 1,2-propanediol, 1,3-butanediol, 1,4-butanediol, 2,3-butanediol, 1,5-pentanediol, 2-methyl-2,4-pentanediol, 1,6-hexanediol, and 2-ethyl-1,3-hexanediol.

5. The ink composition according to claim 1, wherein the solvent C contains at least one alcohol selected from 1-octanol, 1-nonanol, 1-decanol, 1-undecanol, 1-dodecanol, 1-tridecanol, 2-nonanol, and 2-undecanol.

6. The ink composition according to claim 1, wherein the content ratio of the solvent C with respect to the ink is 1 mass % or more.

7. The ink composition according to claim 2, wherein as the solvent A, a naphthene-based compound is contained.

8. The ink composition according to claim 1, wherein the solvent A further contains 7-ethyl-2-methyl-4-undecanol.

9. The ink composition according to claim 1, wherein as the solid component, a functional layer forming material is contained.

10. The ink composition according to claim 9, wherein the functional layer forming material is a material for forming one layer selected from a functional layer composed of multiple layers including a light-emitting layer of an organic EL element.

11. The ink composition according to claim 1, wherein as the solid component, a color material is contained.

12. The ink composition according to claim 1, wherein
    as the solid component, a light transmissive resin which does not contain a color material is contained, and
    the content ratio of the resin is 0.1 mass % or more and 10 mass % or less.

13. An ink composition comprising:
    a solid component;
    a hydrophobic solvent A;
    a hydrophilic solvent B; and
    an amphiphilic solvent C,
    wherein:
    the solvent C is an alcohol having 8 or more carbon atoms, and
    the content ratio of the solvent C with respect to the ink is 1 mass % or more.

14. An ink composition comprising:
    a solid component;
    a hydrophobic solvent A that contains at least one compound selected from aromatic compounds and hydrocarbon-based compounds;
    a hydrophilic solvent B that contains at least one compound selected from glycol ether-based compounds and alkane diol-based compounds; and
    an amphiphilic solvent C,
    wherein:
    the solvent C is a monohydric alcohol having 8 or more carbon atoms,
    the glycol ether-based compounds are diethylene glycol, triethylene glycol, dipropylene glycol, and tetraethylene glycol, and
    the alkane diol-based compounds are 1,2-ethanediol, 1,2-propanediol, 1,3-butanediol, 1,4-butanediol, 2,3-butanediol, 1,5-pentanediol, 2-methyl-2,4-pentanediol, 1,6-hexanediol, and 2-ethyl-1,3-hexanediol.

* * * * *